United States Patent
Song

(10) Patent No.: US 10,565,915 B2
(45) Date of Patent: Feb. 18, 2020

(54) ARRAY SUBSTRATE, DISPLAY DEVICE, AND FAULT REPAIR METHOD FOR ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Song Song, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 471 days.

(21) Appl. No.: 15/310,503

(22) PCT Filed: Feb. 6, 2016

(86) PCT No.: PCT/CN2016/073716
§ 371 (c)(1),
(2) Date: Nov. 11, 2016

(87) PCT Pub. No.: WO2017/041432
PCT Pub. Date: Mar. 16, 2017

(65) Prior Publication Data
US 2018/0182667 A1 Jun. 28, 2018
US 2019/0027407 A9 Jan. 24, 2019

(30) Foreign Application Priority Data
Sep. 9, 2015 (CN) .......................... 2015 1 0570154

(51) Int. Cl.
*G09G 3/3266* (2016.01)
*G09G 3/20* (2006.01)
(Continued)

(52) U.S. Cl.
CPC .......... *G09G 3/20* (2013.01); *G02F 1/136259* (2013.01); *G09G 3/34* (2013.01);
(Continued)

(58) Field of Classification Search
CPC .......... G09G 3/20; G09G 3/34; G09G 3/3266; G09G 3/3677; G09G 2300/0408;
(Continued)

(56) References Cited

U.S. PATENT DOCUMENTS 6,680,770 B1 * 1/2004 Nagase ................. G02F 1/1368
349/139
2006/0164587 A1 7/2006 Oh
(Continued)

FOREIGN PATENT DOCUMENTS

CN 1811890 A 8/2006
CN 101409055 A 4/2009
(Continued)

OTHER PUBLICATIONS

English Translation of PCT (CN) International Search Report, Application No. PCT/CN2016/073716, dated May 30, 2016, 3 pps.
(Continued)

*Primary Examiner* — Antonio Xavier
(74) *Attorney, Agent, or Firm* — Armstrong Teasdale LLP

(57) ABSTRACT

The present disclosure discloses an array substrate, a display device and a fault repair method for an array substrate, and belongs to the field of display technology. The array substrate includes a pixel array, a gate driver array including a plurality of gate driver units and configured to output drive signals to pixels in the pixel array, and a repair line overlapping with and insulated from the gate driver units, wherein the repair line is configured to be coupled to the failed gate driver unit and transmits a repair signal to cause the failed gate driver unit to output a normal drive signal,
(Continued)

when any gate driver unit fails. The added repair line can realize the function of repairing when the gate driver unit fails, and improve the production efficiency of the array substrate.

11 Claims, 5 Drawing Sheets

(51) Int. Cl.
*G02F 1/1362* (2006.01)
*G09G 3/34* (2006.01)
*H01L 27/12* (2006.01)
*G02F 1/1345* (2006.01)
*G09G 3/36* (2006.01)

(52) U.S. Cl.
CPC ........ *H01L 27/1244* (2013.01); *G02F 1/1345* (2013.01); *G02F 1/13454* (2013.01); *G02F 2001/136263* (2013.01); *G02F 2001/136272* (2013.01); *G09G 3/3266* (2013.01); *G09G 3/3677* (2013.01); *G09G 2300/0408* (2013.01); *G09G 2310/0267* (2013.01); *G09G 2310/0286* (2013.01); *G09G 2330/08* (2013.01)

(58) Field of Classification Search
CPC ... G09G 2300/0267; G09G 2310/0286; G09G 2330/08
See application file for complete search history.

(56) References Cited

U.S. PATENT DOCUMENTS

| | | | | |
|---|---|---|---|---|
| 2007/0132700 | A1* | 6/2007 | Cho | G09G 3/3677 345/100 |
| 2008/0158127 | A1* | 7/2008 | Chang | G02F 1/136259 345/93 |
| 2012/0025855 | A1* | 2/2012 | Chang | G09G 3/006 324/750.3 |
| 2014/0184969 | A1 | 7/2014 | Ro et al. | |
| 2015/0212379 | A1* | 7/2015 | Wang | G02F 1/13452 257/499 |
| 2015/0294636 | A1 | 10/2015 | Yu | |
| 2015/0357355 | A1* | 12/2015 | Itoh | G02F 1/136259 257/43 |
| 2016/0140935 | A1* | 5/2016 | Hwang | G09G 5/18 345/204 |
| 2016/0189794 | A1* | 6/2016 | Lou | G11C 19/28 345/214 |
| 2016/0260405 | A1* | 9/2016 | Dai | G09G 3/3677 |
| 2016/0291380 | A1* | 10/2016 | Hong | G02F 1/13454 |
| 2016/0313620 | A1* | 10/2016 | Dai | G02F 1/136259 |

FOREIGN PATENT DOCUMENTS

| | | |
|---|---|---|
| CN | 101510411 A | 8/2009 |
| CN | 101533621 A | 9/2009 |
| CN | 103680388 A | 3/2014 |
| CN | 105044946 A | 11/2015 |
| JP | 2011033846 A | 2/2011 |
| KR | 2009006532 A | 1/2009 |

OTHER PUBLICATIONS

PCT (CN) Written Opinion, Application No. PCT/CN2016/073716, dated May 30, 2016, 9 pps.: with English Translation.
China First Office Action, Application No. 201510570154.9, dated Aug. 24, 2017, 17 pps.: with English translation.

* cited by examiner

ARRAY SUBSTRATE, DISPLAY DEVICE, AND FAULT REPAIR METHOD FOR ARRAY SUBSTRATE

CROSS REFERENCE TO RELATED APPLICATIONS

This application is a National Stage entry of PCT/CN2016/073716 filed Feb. 6, 2016, which claims the benefit and priority of Chinese Patent Application No. 201510570154.9, filed on Sep. 9, 2015, the disclosures of which are incorporated herein in their entirety as part of the present application.

BACKGROUND

The present disclosure relates to the field of display technology, and particularly, to an array substrate, a display device and a fault repair method for array substrate.

In the field of display technology, integrated electronic systems have become increasingly prominent with a series of advantages, such as small size, light weight, low cost, a small number of production steps. The integration of related components in display devices has become one of important development directions in the field of display technology.

The prior art provides an array substrate on which a gate driver of a display device is integrated, and the gate driver integrated on the array substrate is called a Gate Driver On Array (GOA). The GOA array includes a plurality of GOA units, which are integrated on the array substrate in the form of a row array.

In the production of the array substrate, the plurality of GOA units on the array substrate are fabricated by a corresponding lithography process. When an individual GOA unit among the plurality of GOA units fails, the existing technology is difficult to repair it, thereby causing the entire array substrate unable to operate normally. Thus, there currently is an urgent need for an array substrate that can be repaired in the case of the individual GOA unit failing.

BRIEF DESCRIPTION

Embodiments of the present disclosure provide an array substrate, a display device, and a repairing method.

According to a first aspect, embodiments of the present disclosure provide an array substrate including a pixel array, a gate driver array including a plurality of gate driver units and configured to output drive signals to pixels in the pixel array, and a repair line overlapping with and insulated from the gate driver units. When any gate driver unit fails, the repair line is coupled to the failed gate driver unit and transmits a repair signal to cause the failed gate driver unit to output a normal drive signal.

In embodiments of the present disclosure, the repair line is connected to an output signal line of the failed gate driver unit.

In embodiments of the present disclosure, the gate driver unit includes a driver transistor for generating and outputting a drive signal, and a control module for controlling the driver transistor. The repair line is connected to the control electrode of the driver transistor of the failed gate driver unit.

In embodiments of the present disclosure, the output signal line of the failed gate driver unit is disconnected from the driver transistor of the failed gate driver unit for generating and outputting the drive signal.

In embodiments of the present disclosure, the driver transistor of the failed gate driver unit is disconnected from the control module.

In embodiments of the present disclosure, the gate driver unit further includes a holding capacitor for holding a control voltage for the driver transistor, the holding capacitor is connected to the control electrode of the driver transistor, and the connection point connecting the holding capacitor and the control electrode of the driver transistor is located between the connection point connecting the repair line and the control electrode of the driver transistor, and the control electrode of the driver transistor.

In embodiments of the present disclosure, the array substrate further includes an output module which is connected to the repair line and generates a repair signal.

According to a second aspect, embodiments of the present disclosure provide a display device including any of the above-described array substrates.

According to a third aspect, embodiments of the present disclosure provide a fault repair method for an array substrate, the array substrate is the above-described array substrate, the method includes coupling a repair line in the array substrate to the failed gate driver unit when any gate driver unit in a gate driver array of the array substrate fails, and transmitting a repair signal via the repair line to cause the failed gate driver unit to output a normal drive signal.

In an embodiment of the disclosure, coupling the repair line to the failed gate driver unit includes connecting the repair line to an output signal line of the failed gate driver unit.

In embodiments of the present disclosure, the gate driver unit includes a driver transistor for generating and outputting a drive signal, and a control module for controlling the driver transistor. Coupling the repair line to the failed gate driver unit includes connecting the repair line to the control electrode of the driver transistor of the failed gate driver unit.

In embodiments of the present disclosure, the repair line is coupled to the failed gate driver unit by laser welding.

In embodiments of the present disclosure, transmitting the repair signal via the repair line includes determining a starting time for outputting the repair signal based on the position of the failed gate driver unit in the gate driver array, and outputting the repair signal at the starting time.

In embodiments of the present disclosure, when the repair line is connected to the output signal line of the failed gate driver unit, the repair signal is the same as the drive signal outputted by the failed gate driver unit if not failed.

In embodiments of the present disclosure, when the repair line is connected to the control electrode of the driver transistor of the failed gate driver unit, the repair signal includes a high-level signal having a duration equal to the period of a clock signal of the array substrate, and a signal having a waveform opposite to the clock signal after the high-level signal.

In embodiments of the present disclosure, after connecting the repair line to the output signal line of the failed gate driver unit, the output signal line is disconnected from the driver transistor of the failed gate driver unit for generating and outputting the drive signal.

In embodiments of the present disclosure, after connecting the repair line to the control electrode of the driver transistor of the failed gate driver unit, the driver transistor is disconnected from the control module.

The array substrate provided by the embodiments of the present disclosure includes a repair line. The repair line is insulated from and overlaps with the gate driver unit, and is configured to be coupled to the failed gate driver unit. When the gate driver unit of the array substrate fails, a repair signal is outputted via the repair line. The added repair line can realize the function of repairing when the gate driver unit fails, and improve the production efficiency of the array substrate.

BRIEF DESCRIPTION OF THE DRAWINGS

In order to more clearly illustrate the technical solution in embodiments of the present disclosure, the drawings to be used in the description of the embodiments will be briefly described below. Obviously the drawings in the following description are merely for some embodiments of the present disclosure, and those skilled in the art may also obtain other drawings according to these drawings without creative work.

DETAILED DESCRIPTION

In order to make technical solutions and advantages of the embodiments of the present disclosure clearer, the technical solutions in the embodiments of the present disclosure will be clearly and completely described below with reference to the accompanying drawings in the embodiments of the present disclosure. It will be apparent that the described embodiments are merely part of embodiments of the present disclosure, but not all the embodiments. All the other embodiments obtained by those skilled in the art based on the embodiments of the present disclosure without creative effort are within the scope of the protection of the present disclosure.

Figure 1:
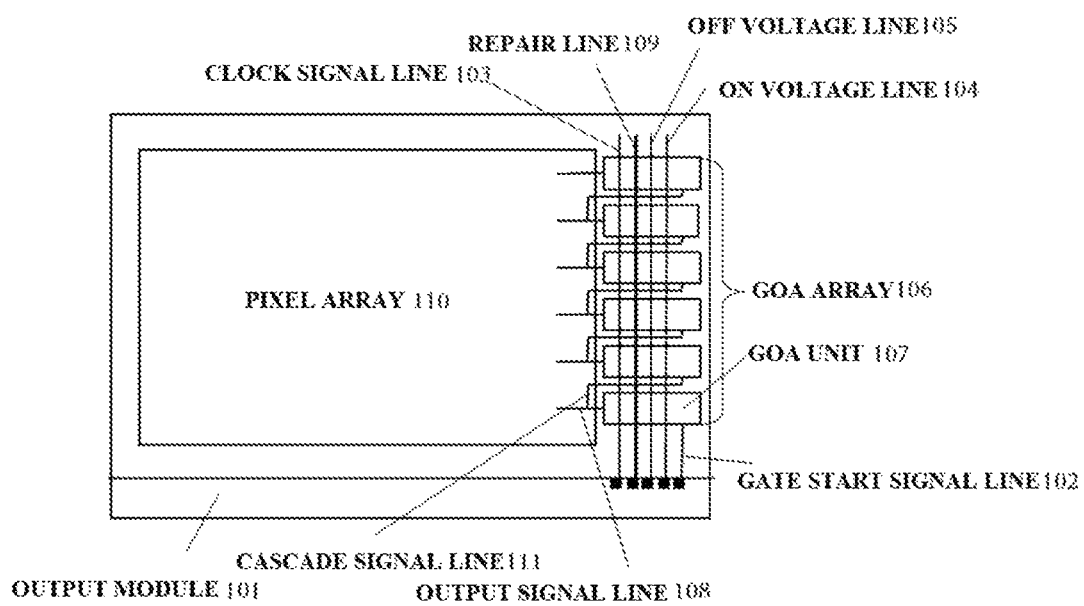
FIG. 1 is a schematic structural diagram of an array substrate according to a first embodiment of the present disclosure.

FIG. 1 is a schematic structural diagram of an array substrate according to a first embodiment of the present disclosure. As shown in FIG. 1, the array substrate includes a pixel array 110, a GOA array 106 that includes a plurality of GOA units 107 and is configured to output a drive signal to pixels in the pixel array 110, and a repair line 109 overlapping with and insulated from the gate driver units (GOA units), wherein the repair line is configured to be coupled to the failed gate driver unit and transmits a repair signal to cause the failed gate driver unit to output a normal drive signal, when any gate driver unit fails.

In order to realize the display function, the array substrate further includes a gate start signal line 102, a clock signal line 103, an ON voltage line 104, and an OFF voltage line 105 connected to an output module 101. The output module 101 has a plurality of output ports, each of which is connected to a corresponding signal line, to output a gate start signal, a clock signal, an ON voltage, or an OFF voltage to the corresponding signal line, respectively. The output module 101 may be an independent circuit board and may be a circuit integrated on the array substrate, and the specific form of the output module 101 of the present disclosure is not limited. The gate start signal line 102 is used to transmit the gate start signal, which is the start signal outputted by the output module 101 to the GOA unit of the first row. The gate start signal may be outputted from the output module 101 to the GOA unit of the first row via the gate start signal line 102 at the beginning of each frame of the picture. The clock signal line 103 is used for outputting a clock signal to each GOA unit. As shown in FIG. 1, the present embodiment will be described by taking one clock signal line 103 as an example. In practice, the array substrate may include a plurality of clock signal lines, and the number of the clock signal lines in the present disclosure is not limited. The ON voltage line 104 is used to provide an ON voltage to each GOA unit. The OFF voltage line 105 is used to provide an OFF voltage to each GOA unit. The GOA array 106 is an array including a plurality of GOA units 107. As shown in FIG. 1, the array substrate provided in this embodiment includes one GOA array 106 located on one side of the substrate. In practice, one array substrate may include two GOA arrays located on both sides of the substrate, and the present disclosure does not limit the position and number of GOA arrays. Each GOA unit is connected to an output signal line 108, and the output signal line 108 is used for outputting an output signal of each GOA unit, i.e. a drive signal, to each row of pixels in the pixel array 110 to implement scanning of the pixel array row by row. It should be noted that the array substrate may further include a cascade signal line 111 connecting the plurality of GOA units and other elements not shown in the figure for image display. The present disclosure does not specifically limit the other elements included in the array substrate. Also, the specific arrangement of the above-mentioned elements for realizing the display function may be adjusted according to the specific array substrate, and the above description is for a more clear explanation of the principle of the present disclosure only, but is not intended to limit the present disclosure.

As shown in FIG. 1, in order that the array substrate has a repair function when an individual GOA unit fails, the repair line 109 of the array substrate in this example is connected to an output port of a repair channel provided on the output module 101. When a GOA unit on the array substrate fails, the repair line may be coupled to the failed GOA unit and the output module outputs a repair signal to the repair line. The repair signal may be used to resume the normal drive signal outputted by the GOA unit or to directly replace the drive signal outputted by the failed GOA unit, so that the array substrate works properly. The coupling here includes a case of being directly connected to the internal circuit of the GOA unit and also includes a case of being connected to an output signal line of the GOA unit.

When the GOA unit is not failed, i.e., in a state needing no repairing, the repair line 109 is insulated from and alternately overlapping with the plurality of GOA units. The insulation and the alternate overlapping can be achieved by following manner, specifically including providing the repair line above the plurality of GOA units, alternately overlapping with each GOA unit at a preset location, and at the preset location, providing an insulating layer between the repair line and the GOA unit, so as to implement the insulating and alternate overlapping.

Figure 2:
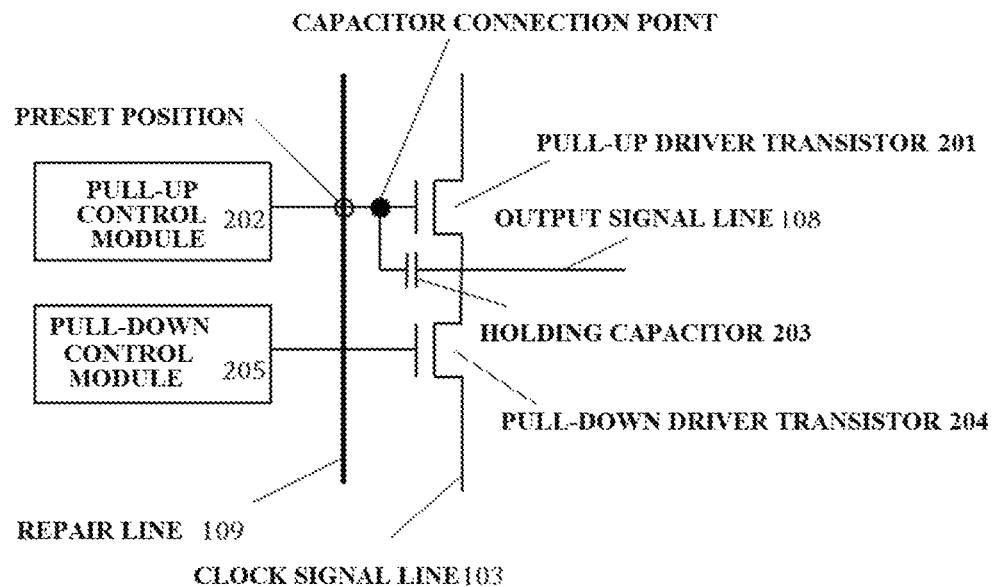
FIG. 2 is a first schematic circuit diagram of a GOA unit in the embodiment shown in FIG. 1.
Figure 3:
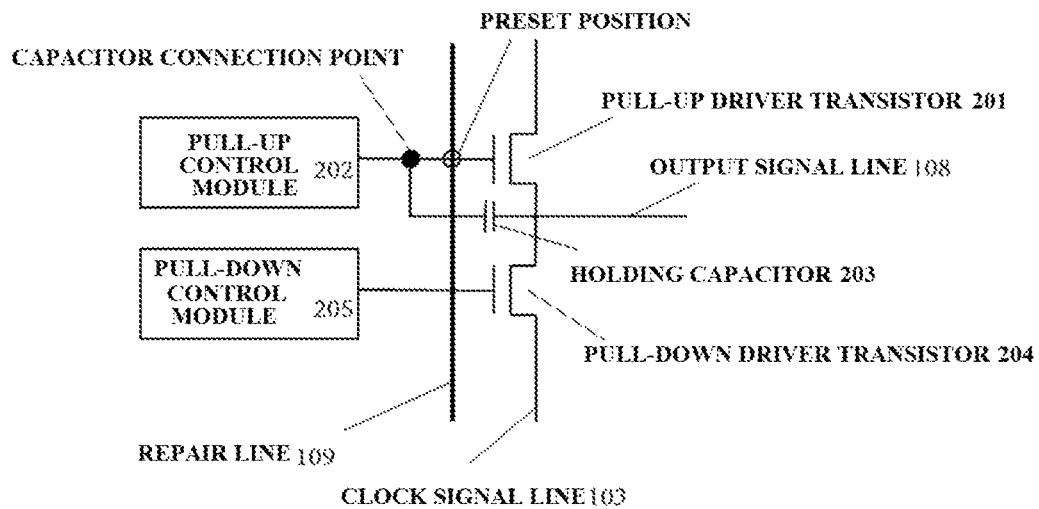
FIG. 3 is a second schematic circuit diagram of the GOA unit in the embodiment shown in FIG. 1.

In this example, the preset position has a first implementation manner, as the gate line position of the pull-up driver transistor of the GOA unit shown in FIGS. 2-3. The first implementation of the preset position and the corresponding first repair method will be described below in detail with reference to FIGS. 2 to 7.

FIG. 2 is a first schematic circuit diagram of a GOA unit in the embodiment shown in FIG. 1. FIG. 3 is a second schematic circuit diagram of the GOA unit in the embodiment shown in FIG. 1. As shown in FIGS. 2 and 3, the GOA unit includes a pull-up driver transistor 201, a pull-up control module 202, a holding capacitor 203, a pull-down driver transistor 204, and a pull-down control module 205. The second electrode of the pull-up driver transistor 201 is connected to the output signal line 108 and is configured to output a high-level voltage to the output signal line 108 as a drive signal for the pixels. The pull-up control module 202 is connected to the control electrode of the pull-up driver transistor 201 and is configured to control the pull-up driver transistor 201. The holding capacitor 203 is connected between the control electrode and the second electrode of the pull-up driver transistor 201 and is configured to hold the voltage between the control electrode and the second electrode of the pull-up driver transistor 201. The first electrode of the pull-down driver transistor 204 is connected to the output signal line 108 and is configured to output a low-level voltage to the output signal line 108. The pull-down control module 205 is connected to the control electrode of the pull-down driver transistor 204 and is configured to control the pull-down driver transistor 204. The pull-up driver transistor 201 may be a Thin Film Transistor (TFT) for generating an output signal of the GOA unit, and its control electrode is the gate electrode.

As shown in FIGS. 2 and 3, the preset position may be the position on the gate line connected to the gate electrode of the pull-up driver transistor 201. One end of the gate line of the pull-up driver transistor 201 is connected to the gate electrode of the pull-up driver transistor 201 and the other end thereof is connected to the pull-up control module 202. In addition, the gate line may also be connected to the holding capacitor 203 at a capacitor connection point. It should be noted that in FIG. 2, the description is given taking a case where the preset position is located at the side of the capacitor connection point away from the pull-up driver transistor 201, that is, the connection point connecting the holding capacitor 203 and the control electrode of the pull-up driver transistor 201 is located between the connection point connecting the repair line 109 and the control electrode of the pull-up driver transistor 201, and the control electrode of the pull-up driver transistor 201. In practice, the preset position can also be as shown in FIG. 3, located at the side of the capacitor connection point close to the pull-up driver transistor 201.

Accordingly, in the case of the array substrate abovementioned, when the GOA unit fails, embodiments of the present disclosure provide a fault repair method for an array substrate, the method including when a gate driver unit fails, coupling a repair line to the failed GOA unit, and during the operation of the array substrate, outputting a repair signal via the repair line. Specifically, the coupling or connecting manner may be laser welding. It should be noted that, in practice, ultrasonic spot welding equipment, or pulse current spot welding equipment may also be used for welding, or other processes may be used, and the present disclosure is not particularly limited thereto. Because in practice, a GOA unit being failed may include different situations, such as not outputting any signal and outputting wrong signals. As to the situation of outputting wrong signals, in order to guarantee that the repaired circuit is not affected by the wrong signals, after connecting the repair line to the failed GOA unit, the method provided in the embodiment of the present disclosure further includes disconnecting the connection point connecting the repair line and the failed GOA unit from the failed GOA unit.

Figure 4:
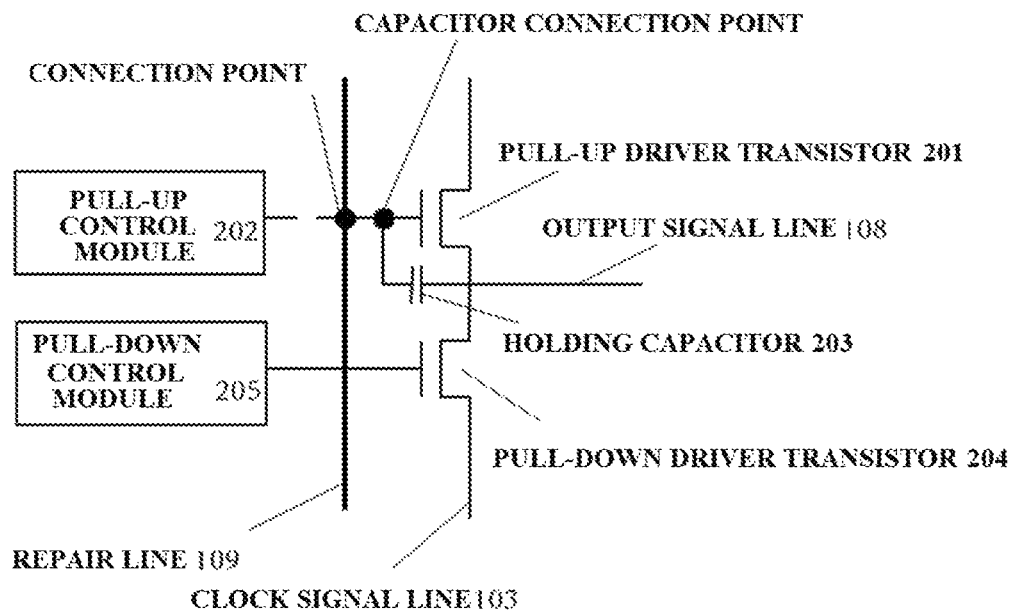
FIG. 4 is a schematic circuit diagram of the GOA unit shown in FIG. 2 after being repaired using a first repair method.

FIG. 4 is a schematic circuit diagram of the GOA unit shown in FIG. 2 after being repaired using a first repair method. As shown in FIG. 4, the repair line 109 is connected to the control electrode of the pull-up driver transistor 201 of the failed GOA unit, and the pull-up driver transistor 201 is disconnected from the pull-up control module 202. During the operation of the array substrate, the output module on the array substrate is controlled to output the corresponding repair signal via the repair line according to the position of the failed GOA unit in the GOA array.

In the first repair mode in the present example, the repair signal is used to resume the output signal of the failed GOA unit to be normal. In this example, the repair signal can be obtained by the following procedure.

The starting time of the repair signal is determined based on the location of the failed GOA unit in the GOA array. Specifically, the time at which the failed GOA unit should correctly output the signal is determined as the starting time. The output module outputs a first rising waveform at the starting time, and the duration of the first rising waveform is equal to the period of the clock signal of the array substrate. Specifically, the rising waveform may be a square wave, that is, a high level voltage. After outputting the first rising waveform at the starting time, the output module outputs a waveform opposite to the clock signal.

The operation of the array substrate before and after the repairing is explained in more detail with reference to FIGS. 5 to 7 in order to more clearly illustrate the repair effect.

Figure 5:
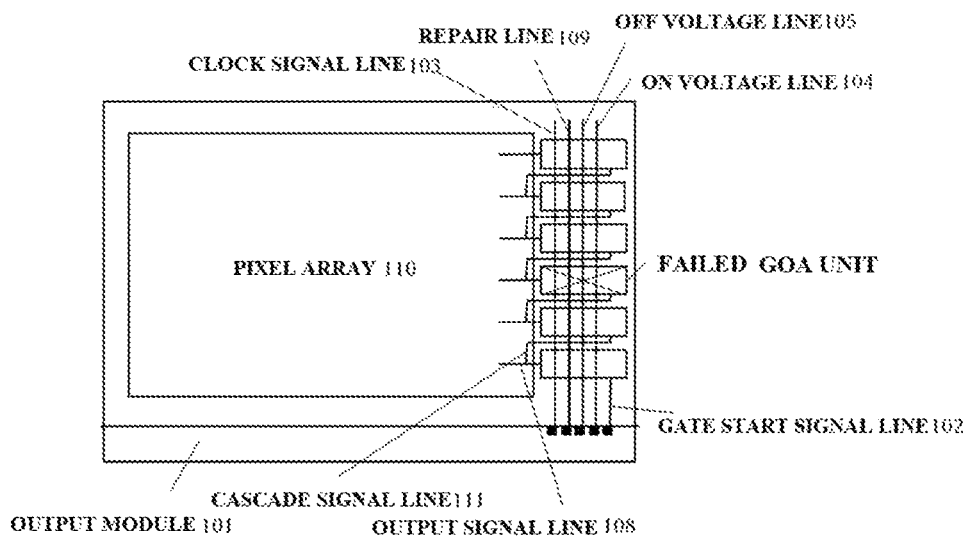
FIG. 5 is a schematic structural diagram of one failed GOA unit of the array substrate of the embodiment shown in FIG. 1.

FIG. 5 is a schematic structural diagram of one failed GOA unit of the array substrate of the embodiment shown in FIG. 1. As shown in FIG. 5, the GOA unit connected to the gate start signal line 102 is determined to be the first GOA unit, and other GOA units are sequentially determined as the second GOA unit, the third GOA unit, and the fourth GOA unit . . . , wherein the third GOA unit fails.

Figure 6:
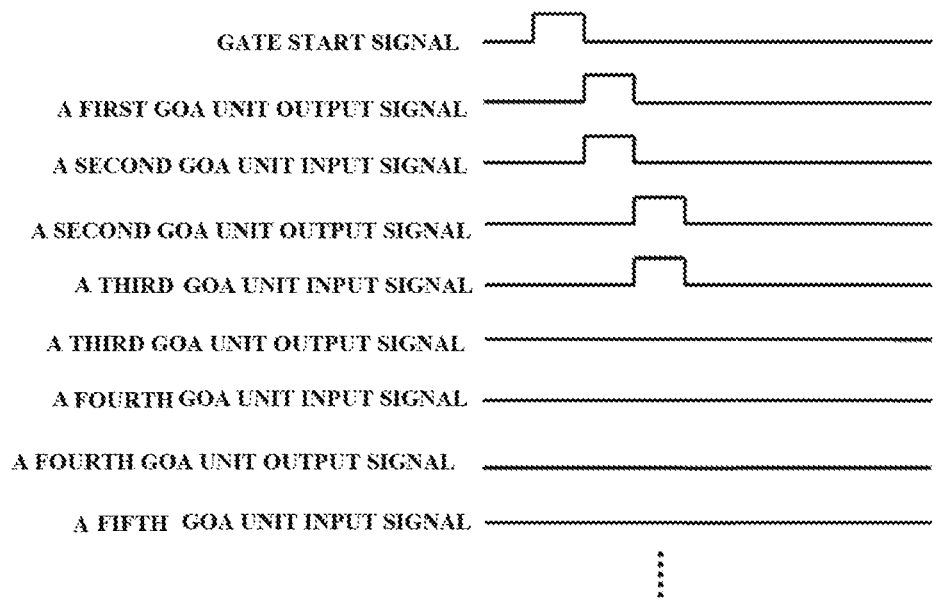
FIG. 6 is a schematic diagram of an operation signal of the array substrate shown in FIG. 5.

FIG. 6 is a schematic diagram of an operation signal of the array substrate shown in FIG. 5. As shown in FIG. 6, since the third GOA unit fails, there is no output signal from the third GOA unit and the subsequent GOA unit.

Figure 7:
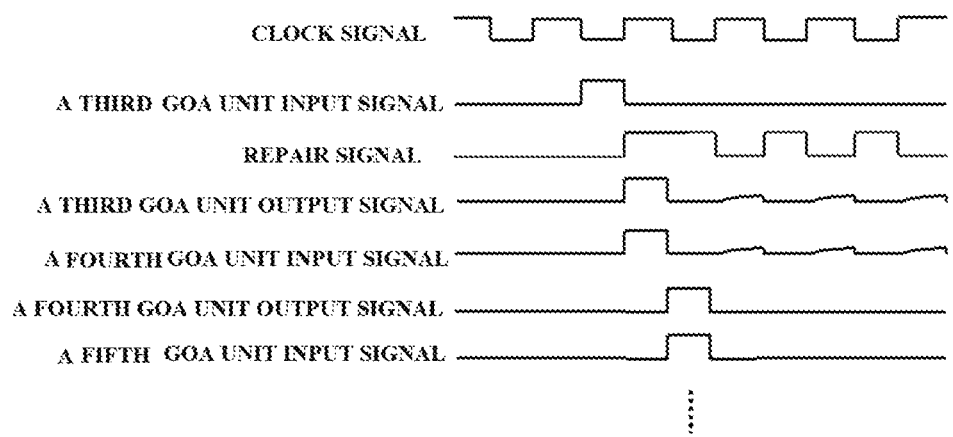
FIG. 7 is a schematic diagram of the operation signal after being repaired using the first repair method of the array substrate shown in FIG. 5.

FIG. 7 is a schematic diagram of the operation signal after being repaired using the first repair method of the array substrate shown in FIG. 5. As shown in FIG. 7, since the repair signal is used to control the pull-up driver transistor 201 of the third GOA unit, the output signal of the third GOA unit returns to normal, and further the operation of the array substrate returns to normal. It should be noted that due to the presence of the holding capacitor 203, the output signal of the third unit is affected by the discharge of the holding capacitor 203, resulting in the fluctuation of the signal. In practice, since the fluctuation is maintained at half or less of the signal strength, it can be ignored. In order to keep the simple and easy operation of the repairing mode and not to have too much impact on the original circuit, the disclosure does not deal with this signal fluctuation.

Next, the second implementation of the preset position and a corresponding second repair method will be briefly described with reference to FIGS. 8 and 9. The same portions as those of the embodiment shown in FIGS. 1 to 7 will not be described again.

Figure 8:
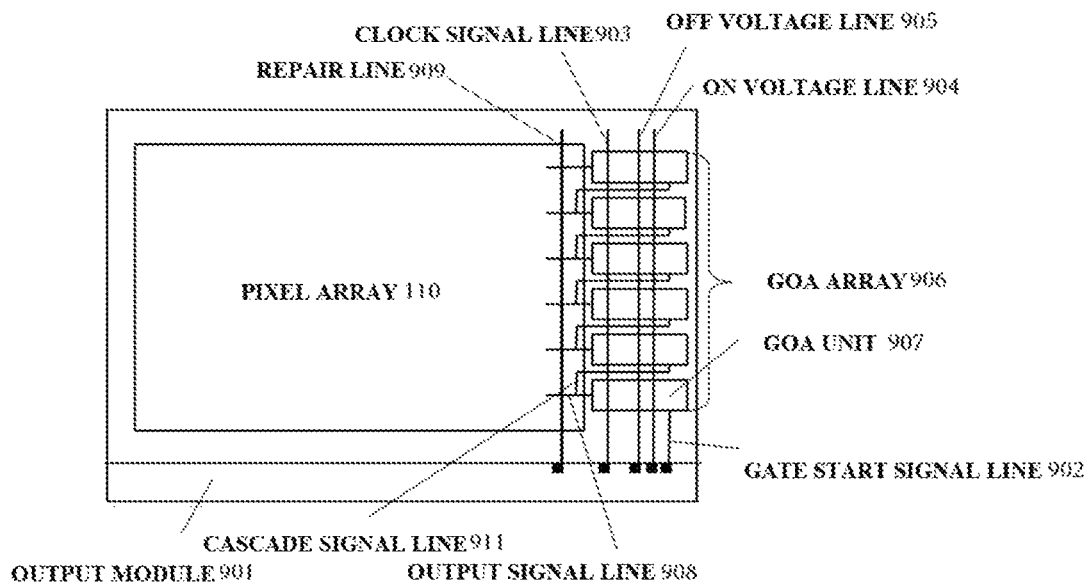
FIG. 8 is a schematic structural diagram of an array substrate structure according to a second embodiment of the present disclosure.

FIG. 8 is a schematic structural diagram of an array substrate structure according to a second embodiment of the present disclosure. As shown in FIG. 8, when a GOA unit is not failed, the repair line 909 of the array substrate is insulated from and overlaps with the output signal line 908 of each GOA unit. That is, in correspondence with the first embodiment, the preset position in this example has the second implementation, as the position on the output signal line 908 as shown in FIG. 8.

In the event of a failed GOA unit, the repair line is connected to the output signal line 908 of the failed GOA unit. As the same in the first embodiment, to avoid interference from the failed GOA unit, the output signal line 908 may also be disconnected from the circuit of the failed GOA unit that generates the output signal, to disconnect the failed gate driver unit from the corresponding pixels.

In this example, during the operation of the array substrate, outputting the repair signal to the repair line 909 by the output module 901 includes determining the starting time of the repair signal based on the position of the failed GOA unit in the GOA array, and outputting the repair signal at the starting time by the output module 901, wherein the repair signal is the same as the drive signal output from the GOA unit in the event of no fault.

Figure 9:
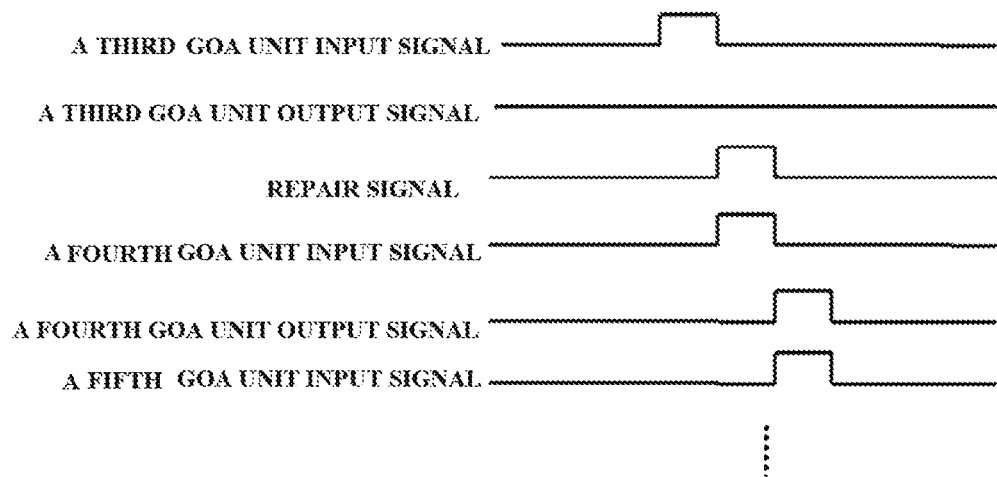
FIG. 9 is a schematic structural diagram of an operation signal of the array substrate shown in FIG. 8 after being repaired using a second repair method.

FIG. 9 is a schematic structural diagram of an operation signal of the array substrate shown in FIG. 8 after being repaired using a second repair method. As shown in FIG. 9, since the repair line 909 is directly connected to the output signal line of the failed GOA unit, the repair signal should be the same as the output signal of the failed GOA unit in the normal operation.

Further, a third embodiment of the present disclosure provides a display device including any of the above-described array substrates.

All of the above alternative technical solutions may be combined in any way to form alternative embodiments of the present disclosure and will not be described in detail herein.

It will be appreciated by those skilled in the art that all or a portion of the steps of implementing the embodiments described above may be accomplished by hardware and may be accomplished by programs that may be stored in a computer-readable storage medium which may be a read-only memory, a magnetic disk, or an optical disk, etc.

The above is only for an example embodiment of the present disclosure and is not intended to limit the present disclosure. Any modifications, equivalent substitutions, improvements and the like within the spirit and principle of the present disclosure are intended to be included within the scope of the present disclosure.

What is claimed is:

1. A fault repair method for an array substrate including a pixel array, a gate driver array comprising a plurality of gate driver circuits and configured to output drive signals to pixels in the pixel array, and a repair line overlapping with and insulated from the gate driver circuits, wherein when any gate driver circuit fails, the repair line is configured to couple to the failed gate driver circuit and transmit a repair signal to cause the failed gate driver circuit to output a normal drive signal, the method comprising:

coupling the repair line to the failed gate driver circuit; and
transmitting the repair signal via the repair line to cause the failed gate driver circuit to output the normal drive signal;
wherein coupling the repair line to the failed gate driver circuit comprises:
connecting the repair line to an output signal line of the failed gate driver circuit;
wherein transmitting the repair signal via the repair line comprises:
determining a starting time for outputting the repair signal based on a position of the failed gate driver circuit in the gate driver array; and
outputting the repair signal at the starting time; and
wherein the repair signal includes i) a high-level signal having a duration equal to a period of a clock signal of the array substrate and ii) a signal having a waveform opposite to the clock signal after the high-level signal, when the repair line is connected to a control electrode of a driver transistor of the failed gate driver circuit.

2. The method according to claim 1, wherein each gate driver circuit comprises i) a driver transistor configured to generate and output the drive signal and ii) a control circuit configured to control the driver transistor.

3. The method according to claim 2, wherein each gate driver circuit further comprises a holding capacitor configured to hold a control voltage for the driver transistor.

4. The method according to claim 1, further comprising an output circuit connected to the repair line and configured to generate the repair signal.

5. A display device comprising the array substrate repaired according to the method of claim 1.

6. The method according to claim 1, wherein each gate driver circuit includes i) a driver transistor configured to generate and output the drive signal and ii) a control circuit configured to control the driver transistor, and wherein coupling the repair line to the failed gate driver circuit comprises connecting the repair line to a control electrode of the driver transistor.

7. The method according to claim 6, wherein the repair line is coupled to the failed gate driver circuit by laser welding.

8. The method according to claim 6, wherein the repair signal is the same as the drive signal outputted by the failed gate driver circuit if the failed gate driver circuit had not failed, when the repair line is connected to the output signal line of the failed gate driver circuit.

9. The method according to claim 6, wherein the output signal line is disconnected from the driver transistor of the failed gate driver circuit after connecting the repair line to the output signal line of the failed gate driver circuit.

10. The method according to claim 6, wherein the driver transistor is disconnected from the control circuit after connecting the repair line to the control electrode of the driver transistor of the failed gate driver circuit.

11. The method according to claim 6, wherein the repair signal is the same as the drive signal outputted by the failed gate driver circuit if the failed gate driver circuit had not failed.

* * * * *